United States Patent
Liao et al.

(10) Patent No.: US 9,063,422 B2
(45) Date of Patent: *Jun. 23, 2015

(54) PHOTOSENSITIVE RESIN COMPOSITION AND APPLICATION OF THE SAME

(71) Applicant: CHI MEI CORPORATION, Tainan (TW)

(72) Inventors: Hao-Wei Liao, Tainan (TW); Ching-Yuan Tseng, Tainan (TW); Chun-Hsien Lee, Tainan (TW); Ming-Ju Wu, Tainan (TW); Chun-An Shih, Tainan (TW)

(73) Assignee: Chi Mei Corporation, Tainan (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/667,764

(22) Filed: Nov. 2, 2012

(65) Prior Publication Data

US 2013/0135763 A1      May 30, 2013

(30) Foreign Application Priority Data

Nov. 25, 2011   (TW) .............................. 100143366 A

(51) Int. Cl.
*G02B 5/23* (2006.01)
*G03F 7/075* (2006.01)
*G02B 5/20* (2006.01)
*G03F 7/027* (2006.01)
*G02B 5/22* (2006.01)
*G03C 1/00* (2006.01)
*G03F 7/00* (2006.01)

(52) U.S. Cl.
CPC .............. *G03F 7/0757* (2013.01); *G02B 5/22* (2013.01); *G02B 5/201* (2013.01); *G03F 7/0007* (2013.01); *G03F 7/027* (2013.01)

(58) Field of Classification Search
USPC ........ 252/586; 359/891; 428/447; 430/270.1, 430/280.1, 7, 321; 522/6, 27, 48, 49, 59, 99
See application file for complete search history.

(56) References Cited

U.S. PATENT DOCUMENTS

| | | | | |
|---|---|---|---|---|
| 2008/0220372 A1* | 9/2008 | Lee et al. | ................... | 430/281.1 |
| 2010/0101843 A1* | 4/2010 | Wakabayashi et al. | ........ | 174/258 |

FOREIGN PATENT DOCUMENTS

| | | | | |
|---|---|---|---|---|
| JP | 2000047378 | | 2/2000 | |
| JP | 2008-107529 | * | 5/2008 | ............. G03F 7/075 |
| JP | 2008-116493 | * | 5/2008 | ............. G03F 7/075 |
| JP | 2008268854 | | 11/2008 | |
| JP | 2009145432 | | 7/2009 | |

* cited by examiner

*Primary Examiner* — Bijan Ahvazi

(74) *Attorney, Agent, or Firm* — Jianq Chyun IP Office

(57) ABSTRACT

A photosensitive resin composition includes (A) an alkali-soluble resin, (B) a polysiloxane, (C) an ethylenically unsaturated compound, (D) a photo-initiator, (E) a black pigment, and (F) a solvent. The alkali-soluble resin includes an unsaturated-group-containing resin obtained by subjecting a mixture containing (i) an epoxy compound having at least two epoxy groups and (ii) a compound having at least one carboxyl group and at least one ethylenically unsaturated group to polymerization. A weight ratio of the unsaturated-group-containing resin to the polysiloxane ranges from 0.1 to 3.0. Application of the photosensitive resin composition is also disclosed.

9 Claims, No Drawings

PHOTOSENSITIVE RESIN COMPOSITION AND APPLICATION OF THE SAME

CROSS-REFERENCE TO RELATED APPLICATION

This application claims priority of Taiwanese Application No. 100143366, filed Nov. 25, 2011.

BACKGROUND OF THE INVENTION

1. Field of the Invention

This invention relates to a photosensitive resin composition, more particularly to a photosensitive resin composition for a black matrix of a color filter. This invention also relates to a black matrix formed from the photosensitive resin composition, a color filter including the black matrix, and a liquid crystal display device including the color filter.

2. Description of the Related Art

In order to enhance contrast ratio and display quality of a liquid crystal display device, a black matrix is usually disposed in the gaps formed among stripes or dots of a color filter so as to avoid reduction of the contrast ratio and the color purity due to light leakage among the pixels. A vapor deposited film containing chromium or chromium oxide is used for forming the black matrix. However, there are problems of complicated process and costly material. Therefore, it has been proposed to form the black matrix using a photosensitive resin composition via photo-lithographic technology.

JP 2000-047378 discloses a photosensitive resin composition for forming a black matrix. The photosensitive resin composition includes an alkali-soluble resin obtained by the condensation reaction of phenol with aldehyde, an acid-crosslinkable methylolated melamine compound, a photo-acid generator, a black pigment, and a dispersant. A specified dispersant is used to improve display quality of the photosensitive resin composition which contains a high amount of the black pigment so as to enhance pattern resolution of the black matrix.

JP 2008-268854 discloses a photosensitive resin composition for forming a black matrix. The photosensitive resin composition includes an alkali soluble resin having a carboxylic acid residue and a polymerizable unsaturated group in one molecule, a photopolymerizable monomer having at least one ethylenically unsaturated bond, a photo-initiator, and a black pigment. A specified alkali soluble resin is used to improve pattern resolution of the black matrix formed from the photosensitive resin composition which contains a high amount of the black pigment.

JP 2009-145432 discloses a photosensitive resin composition for forming a black matrix. The photosensitive resin composition includes a resin, a monomer having an ethylenically unsaturated double bond, a photo-initiator, and a pigment. The resin is a heat curable resin, a photosensitive resin, a thermoplastic resin, or combinations thereof. The amount of the black pigment in the total solid of the photosensitive resin composition is controlled so as to improve photosensitivity and development of the photosensitive resin composition containing a high amount of black pigment in a lithographic process.

In order to satisfy the high light-shielding requirement for the black matrix, the amount of the black pigment is increased in the art. However, the black matrix thus formed may have unsatisfactory surface smoothness and inferior stability of surface resistance after heating.

In view of the aforesaid, it is required in the art to provide a photosensitive resin composition for forming a black matrix which has a high light-shielding effect while obtaining superior surface smoothness and better stability of surface resistance after heating.

SUMMARY OF THE INVENTION

Therefore, a first object of the present invention is to provide a photosensitive resin composition for forming a black matrix.

A second object of the present invention is to provide a black matrix formed from the photosensitive resin composition. The matrix thus formed has a high light-shielding effect while obtaining superior surface smoothness and better stability of surface resistance after heating.

A third object of the present invention is to provide a color filter including the black matrix.

A fourth object of the present invention is to provide a liquid crystal display device including the color filter.

According to a first aspect of this invention, there is provided a photosensitive resin composition including (A) an alkali-soluble resin, (B) a polysiloxane, (C) an ethylenically unsaturated compound, (D) a photo-initiator, (E) a black pigment, and (F) a solvent. The alkali-soluble resin (A) includes an unsaturated-group-containing resin (A-1) obtained by subjecting a mixture containing (i) an epoxy compound having at least two epoxy groups and (ii) a compound having at least one carboxyl group and at least one ethylenically unsaturated group to polymerization. A weight ratio of the unsaturated-group-containing resin (A-1) to the polysiloxane (B) ranges from 0.1 to 3.0.

According to a second aspect of this invention, there is provided a black matrix formed from the photosensitive resin composition.

According to a third aspect of this invention, there is provided a color filter including the black matrix.

According to a fourth aspect of this invention, there is provided a liquid crystal display device including the color filter.

DETAILED DESCRIPTION OF THE PREFERRED EMBODIMENTS

As used herein, the term "(meth)acrylic acid" means acrylic acid and/or methacrylic acid. Likewise, the term "(meth)acrylate" means acrylate and/or methacrylate.

The photosensitive resin composition of the present invention includes (A) an alkali-soluble resin, (B) a polysiloxane, (C) an ethylenically unsaturated compound, (D) a photo-initiator, (E) a black pigment, and (F) a solvent. The alkali-soluble resin (A) includes an unsaturated-group-containing resin (A-1) obtained by subjecting a mixture containing (i) an epoxy compound having at least two epoxy groups and (ii) a compound having at least one carboxyl group and at least one ethylenically unsaturated group to polymerization. A weight ratio of the unsaturated-group-containing resin (A-1) to the polysiloxane (B) ranges generally from 0.1 to 3.0, preferably from 0.2 to 2.5, more preferably from 0.3 to 2.0. When the weight ratio is lower than 0.1 or higher than 3.0, the black matrix formed from the photosensitive resin composition may have inferior stability of surface resistance after heating. If the photosensitive resin composition does not contain both the unsaturated-group-containing resin (A-1) and the polysiloxane (B), the stability of surface resistance of the black matrix after heating cannot be enhanced and the surface smoothness of the black matrix is inferior.

Photosensitive Resin Composition and Preparation Thereof:

The photosensitive resin composition of the present invention can be made by mixing the alkali-soluble resin (A), the polysiloxane (B), the ethylenically unsaturated compound (C), the photo-initiator (D), the black pigment (E), and optional additives (G) in the solvent (F) using any of the mixing manners commonly used in the art (for example, using a mixer or a dispersing device) to form a liquid dispersion.

(A) Alkali-Soluble Resin:

The alkali-soluble resin (A) includes the unsaturated-group-containing resin (A-1).

The unsaturated-group-containing resin (A-1) is in an amount ranging generally from 30 to 100 parts by weight, preferably from 50 to 100 parts by weight, and more preferably from 70 to 100 parts by weight based on 100 parts by weight of the alkali-soluble resin (A). The alkali-soluble resin (A) can optionally include (A-2) an other alkali-soluble resin (which will be described in detail hereinafter) other than the unsaturated-group-containing resin (A-1).

(A-1) Unsaturated-Group-Containing Resin:

The unsaturated-group-containing resin (A-1) is obtained by subjecting a mixture containing (i) an epoxy compound having at least two epoxy groups and (ii) a compound having at least one carboxyl group and at least one ethylenically unsaturated group to polymerization. Preferably, the mixture can further contain (iii) an anhydride compound and/or (iv) an epoxy compound other than the epoxy compound (i).

Preferably, the epoxy compound (i) is represented by formula (I):

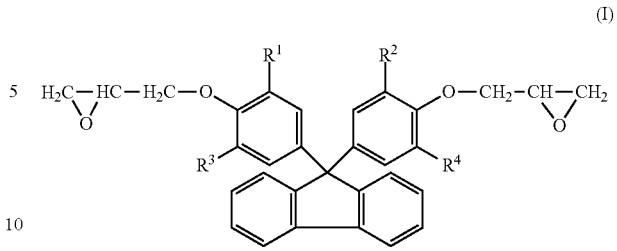

wherein $R^1$, $R^2$, $R^3$, and $R^4$ are independently selected from the group consisting of hydrogen, halogen, a $C_1$-$C_5$ alkyl group, a $C_1$-$C_5$ alkoxy group, a $C_6$-$C_{12}$ aryl group, and a $C_6$-$C_{12}$ aralkyl group.

Examples of the epoxy compound (i) include, but are not limited to, epoxy-containing bisphenol fluorene, which is obtained by subjecting 9,9-bis(4-hydroxyphenyl)fluorene, 9,9-bis(4-hydroxy-3-methylphenyl)fluorene, 9,9-bis(4-hydroxy-3-chlorophenyl)fluorene, 9,9-bis(4-hydroxy-3-bromophenyl)fluorene, 9,9-bis(4-hydroxy-3-fluorophenyl)fluorene, 9,9-bis(4-hydroxy-3-methoxyphenyl)fluorene, 9,9-bis(4-hydroxy-3,5-dimethylphenyl)fluorene, 9,9-bis(4-hydroxy-3,5-dichlorophenyl)fluorene, 9,9-bis(4-hydroxy-3,5-dibromophenyl)fluorene, or the like and epihalohydrin to a reaction. Examples of epihalohydrin include, but are not limited to, epichlorohydrin and epibromohydrin. Commercially available examples of epoxy-containing bisphenol fluorene include, but are not limited to, ESF-300 and the like manufactured by Nippon Steel Chemical Group; PG-100, EG-210, and the like manufactured by Osaka Gas; and SMS-F9PhPG, SMS-F9CrG, SMS-F914PG, and the like manufactured by S.M.S. Technology Co.

Preferably, the epoxy compound (i) is represented by formula (II):

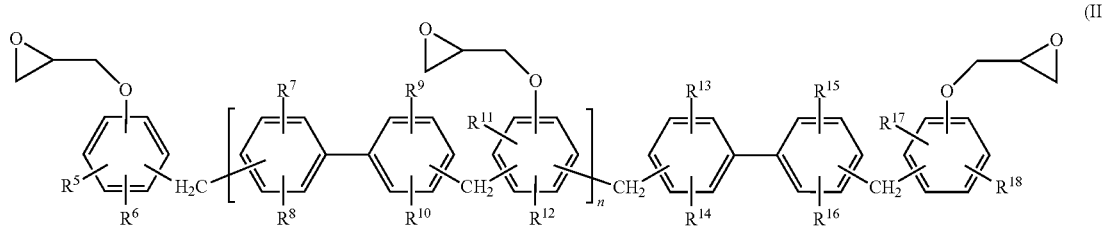

wherein $R^5$-$R^{18}$ are independently selected from the group consisting of hydrogen, halogen, a $C_1$-$C_8$ alkyl group, and a $C_6$-$C_{15}$ aryl group; and n represents an integer ranging from 0 to 10.

Preferably, the epoxy compound (i) represented by formula (II) is obtained by subjecting a compound represented by formula (III) and epihalohydrin to a reaction in the presence of alkali metal hydroxide.

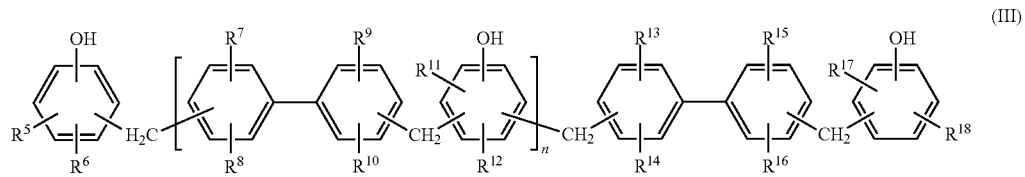

wherein $R^5$-$R^{18}$ and n are as defined in formula (II).

Preferably, the epoxy compound (i) represented by formula (II) is obtained by subjecting a compound represented by formula (IV) and a phenol compound to a condensation reaction in the presence of an acid catalyst to form the compound represented by formula (III) followed by adding an excess amount of epihalohydrin to conduct a dehydrohalogenation reaction.

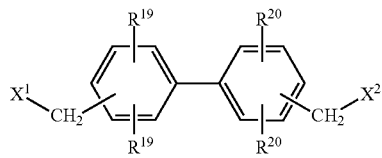

(IV)

wherein $R^{19}$ and $R^{20}$ are independently selected from the group consisting of hydrogen, halogen, a $C_1$-$C_8$ alkyl group, and a $C_6$-$C_{15}$ aryl group; and $X^1$ and $X^2$ are independently selected from the group consisting of halogen (for example, chlorine or bromine), a $C_1$-$C_6$ alkyl group (for example, methyl, ethyl, or t-butyl), and a $C_1$-$C_6$ alkoxy group (for example, methoxy or ethoxy).

Examples of the phenol compound include, but are not limited to, phenol, cresol, ethylphenol, n-propylphenol, isobutylphenol, t-butylphenol, octylphenol, nonylphenol, xylenol, methylbutylphenol, di-t-butylphenol, vinylphenol, propenylphenol, ethinylphenol, cyclopentylphenol, cyclohexylphenol, and cyclohexylcresol. The aforesaid examples of the phenol compound can be used alone or in combinations thereof.

The phenol compound is in an amount ranging preferably from 0.5 to 20 moles and more preferably from 2 to 15 moles based on 1 mole of the compound represented by formula (IV).

Examples of the acid catalyst include, but are not limited to, hydrochloric acid, sulfuric acid, p-toluenesulfonic acid, oxalic acid, boron trifluoride, aluminium chloride anhydrous, and zinc chloride. Preferably, the acid catalyst is hydrochloric acid, sulfuric acid, or p-toluenesulfonic acid. The aforesaid examples of the acid catalyst can be used alone or in combinations thereof. There is no specific limitation to the amount of the acid catalyst. Preferably, the acid catalyst is in an amount ranging from 0.1 wt % to 30 wt % based on 100 wt % of the compound represented by formula (IV).

The condensation reaction can be conducted in the absence of solvent or in the presence of organic solvent. Examples of the organic solvent include, but are not limited to, toluene, xylene, and methyl isobutyl ketone. The aforesaid examples of the organic solvent can be used alone or in combinations thereof. The organic solvent is in an amount ranging preferably from 50 wt % to 300 wt % and more preferably from 100 wt % to 250 wt % based on 100 wt % of a combination of the compound represented by formula (IV) and the phenol compound. Preferably, the condensation reaction is conducted at a temperature ranging from 40° C. to 180° C. for a period ranging from 1 hour to 8 hours.

After the condensation reaction is completed, neutralization or rinsing treatment can be conducted. The neutralization treatment is conducted using a neutralizing agent to adjust the pH value of the solution after the condensation reaction to a range from 3 to 7, preferably from 5 to 7. The neutralizing agent is a basic material, and examples thereof include, but are not limited to, alkali metal hydroxides, such as sodium hydroxide, potassium hydroxide, and the like; alkaline earth metal hydroxides, such as calcium hydroxide, magnesium hydroxide, and the like; organic amines, such as diethylene triamine, triethylene tetramine, aniline, phenylene diamine, and the like; ammonia; and sodium dihydrogen phosphate. The rinsing treatment can be conducted in a commonly used manner. For example, the solution after the condensation reaction is repeatedly extracted using an aqueous solution containing the neutralizing agent. After the neutralization or rinsing treatment is completed, the phenol compound and/or the solvent remaining in the solution can be removed via heating at reduced pressure and a condensation reaction is conducted to obtain the compound represented by formula (III).

The dehydrohalogenation is then conducted using epihalohydrin, for example, epichlorohydrin, epibromohydrin, or a combination thereof. Preferably, alkaline metal hydroxide, such as sodium hydroxide, potassium hydroxide, and the like can be added prior to or during the dehydrohalogenation. Preferably, the dehydrohalogenation is conducted at a temperature ranging from 20° C. to 120° C. for a period ranging from 1 hour to 10 hours.

Alkaline metal hydroxide for the dehydrohalogenation can be added in a form of an aqueous solution thereof. In this way, the aqueous solution of alkaline metal hydroxide is continuously added to a reaction system for the dehydrohalogenation, and at the same time, water and epihalohydrin are continuously distilled out of the system at a reduced or normal pressure so as to separate and remove water and to continuously recycle epihalohydrin back to the reaction system.

Dehydrohalogenation is preferably conducted by adding quaternary ammonium salts, such as tetramethyl ammonium chloride, tetramethyl ammonium bromide, trimethyl benzyl ammonium chloride, and the like as a catalyst in advance and conducting a reaction at a temperature ranging from 50° C. to 150° C. for a period ranging from 1 hour to 5 hours, followed by adding alkaline metal hydroxide or an aqueous solution thereof and further conducting a reaction at a temperature ranging from 20° C. to 120° C. for a period ranging from 1 hour to 10 hours.

Epihalohydrin is in an amount ranging from 1 mole to 20 moles and preferably from 2 moles to 10 moles based on 1 equivalent weight of the hydroxyl group contained in the compound represented in formula (III). The alkaline metal hydroxide added in dehydrohalogenation is in an amount ranging from 0.8 mole to 15 moles and preferably from 0.9 mole to 11 moles based on 1 equivalent weight of the hydroxyl group contained in the compound represented in formula (III).

Additionally, an alcohol (for example, methanol, ethanol, and the like) or an aprotic polar solvent (for example, dimethyl sulfone, dimethyl sulfoxide, and the like) can be added to enhance dehydrohalogenation. When alcohol is used, alcohol is in an amount ranging from 2 wt % to 20 wt % and preferably from 4 wt % to 15 wt % based on 100 wt % of epihalohydrin. When the aprotic polar solvent is used, the aprotic polar solvent is in an amount ranging from 5 wt % to 100 wt % and preferably from 10 wt % to 90 wt % based on 100 wt % of epihalohydrin.

After dehydrohalogenation is completed, a rinsing treatment can be optionally conducted, followed by removing epihalohydrin, alcohol, and the aprotic polar solvent by heating at a temperature ranging from 110° C. to 2500° C. and a reduced pressure lower than 1.3 kPa (10 mmHg).

In order to enhance the removal of hydrolysable halogen from the epoxy resin thus formed, a further dehydrohalogenation can be conducted by adding a solvent such as toluene, methyl isobutyl ketone, and the like, followed by adding an aqueous solution of alkali methal hydroxide such as sodium hydroxide, potassium hydroxide, and the like. In the further dehydrohalogenation, the alkali methal hydroxide is in an amount ranging preferably from 0.01 mole to 0.3 mole and preferably from 0.05 mole to 0.2 moles, based on 1 equivalent weight of the hydroxyl group contained in the compound represented in formula (III). Preferably, the further dehydrohalogenation is conducted at a temperature ranging from 50° C. to 120° C. for a period ranging from 0.5 hour to 2 hours.

After the further dehydrohalogenation is completed, salts can be removed via filtration, rinsing, and the like. The solvent such as toluene, methyl isobutyl ketone, and the like can be removed via heating under reduced pressure so as to obtain the epoxy compound (i) represented by formula (II). Commercial examples of the epoxy compound (i) represented by formula (II) include, but are not limited to, NC-3000, NC-3000H, NC-3000S, and NC-3000P manufactured by Nippon Kayaku.

Preferably, the compound (II) having at least one carboxyl group and at least one ethylenically unsaturated group is selected from (1) acrylic acid, methacrylic acid, 2-methacryloyloxyethylsuccinic acid, 2-methacryloyloxybutylsuccinic acid, 2-methacryloyloxyethyladipic acid, 2-methacryloyloxybutyladipic acid, 2-methacryloyloxyethylhexahydrophthalic acid, 2-methacryloyloxyethylmaleic acid, 2-methacryloyloxypropylmaleic acid, 2-methacryloyloxybutylmaleic acid, 2-methacryloyloxypropylsuccinic acid, 2-methacryloyloxypropyladipic acid, 2-methacryloyloxybutyladipic acid, 2-methacryloyloxypropyltetrahydrophthalic acid, 2-methacryloyloxypropylphthalic acid, 2-methacryloyloxybutylphthalic acid, or 2-methacryloyloxybutylhydrophthalic acid; (2) a compound obtained by subjecting hydroxyl-containing (meth)acrylate and dicarboxylic acid to a reaction; and (3) a hemiester compound obtained by subjecting hydroxyl-containing (meth)acrylate and carboxylic anhydride to a reaction. Examples of the dicarboxylic acid include, but are not limited to, adipic acid, succinic acid, maleic acid, and phthalic acid. Examples of the hydroxyl-containing (meth)acrylate include, but are not limited to, (2-hydroxyethyl)acrylate, (2-hydroxyethyl)methacrylate, (2-hydroxypropyl)acrylate, (2-hydroxypropyl)methacrylate, (4-hydroxybutyl)acrylate, (4-hydroxybutyl)methacrylate, and pentaerythritol trimethacrylate. Examples of the carboxylic anhydride are the same as the examples of the anhydride compound (iii) suitable for making the unsaturated-group-containing resin (A-1).

Examples of the anhydride compound (iii) include, but are not limited to, (1) dicarboxylic anhydride, such as succinic anhydride, maleic anhydride, itaconic anhydride, phthalic anhydride, tetrahydrophthalic anhydride, hexahydrophthalic anhydride, methyl tetrahydrophthalic anhydride, methyl hexahydrophthalic anhydride, methyl endo-methylene tetrahydro phthalic anhydride, chlorendic anhydride, glutaric anhydride, and 1,3-dioxoisobenzofuran-5-carboxylic anhydride; tetracarboxylic anhydride, such as benzophenone tetracarboxylic dianhydride, biphenyl tetracarboxylic dianhydride, 4,4'-oxydiphthalic anhydride, and the like.

Preferably, the epoxy compound (iv) is selected from glycidyl methacrylate, 3,4-epoxycyclohexyl methacrylate, unsaturated glycidyl ether, unsaturated epoxy compound, or combinations thereof. Commercial examples of the unsaturated glycidyl ether include, but are not limited to, Denacol EX-111, Denacol EX-121, Denacol EX-141, Denacol EX-145, Denacol EX-146, Denacol EX-171, Denacol EX-192, and the like manufactured by Nagase Chemtex.

The unsaturated-group-containing resin (A-1) can be obtained by subjecting the epoxy compound (i) represented by formula (I) and the compound (ii) having at least one carboxyl group and at least one ethylenically unsaturated group to polymerization to form a hydroxyl-containing product, followed by adding the anhydride compound (iii) to conduct a further reaction. The anhydride group contained in the anhydride compound (iii) is in an amount ranging preferably from 0.4 equivalent weight to 1 equivalent weight and more preferably from 0.75 equivalent weight to 1 equivalent weight based on 1 equivalent weight of the hydroxyl group contained in the hydroxyl-containing product. When a plurality of the anhydride compounds (iii) are used, they can be added sequentially or simultaneously. When the dicarboxylic anhydride and the tetracarboxylic anhydride are used as the anhydride compound (iii), the molar ratio of the dicarboxylic anhydride to the tetracarboxylic anhydride ranges preferably from 1/99 to 90/10 and more preferably from 5/95 to 80/20. The reaction is conducted at a temperature preferably from 50° C. to 130° C.

Alternatively, the unsaturated-group-containing resin (A-1) can be obtained by subjecting the epoxy compound (i) represented by formula (II) and the compound (ii) having at least one carboxyl group and at least one ethylenically unsaturated group to polymerization to form a hydroxyl-containing product, followed by adding the anhydride compound (iii) and/or the epoxy compound (iv) to conduct a further reaction. The acid value of the compound (ii) is in an amount ranging preferably from 0.8 equivalent weight to 1.5 equivalent weight and more preferably from 0.9 equivalent weight to 1.1 equivalent weight based on 1 equivalent weight of the epoxy group contained in the epoxy compound (i) represented by formula (II). The anhydride compound (iii) is in an amount ranging generally from 10 mole % to 100 mole %, preferably from 20 mole % to 100 mole %, and more preferably from 30 mole % to 100 mole % based on 100 mole % of the hydroxyl group contained in the hydroxyl-containing product.

In order to enhance the reaction for making the unsaturated-group-containing resin (A-1), a basic compound may be added as a catalyst for the reaction. Examples of the catalyst include, but are not limited to, triphenyl phosphine, triphenyl stibine, triethylamine, triethanolamine, tetramethylammonium chloride, and benzyltriethylammonium chloride. The examples of the catalyst can be used alone or in combinations thereof. The catalyst is in an amount ranging preferably from 0.01 part by weight to 10 parts by weight and more preferably from 0.3 part by weight to 5 parts by weight based on 100 parts by weight of a combination of the epoxy compound (i) and the compound (ii).

Additionally, a polymerization inhibitor can be added to control the degree of polymerization. Examples of the polymerization inhibitor include, but are not limited to, methoxyphenol, methylhydroquinone, hydroquinone, 2,6-di-t-butyl-p-cresol, and phenothiazine. The examples of the polymerization inhibitor can be used alone or in combinations thereof. The polymerization inhibitor is in an amount ranging preferably from 0.01 part by weight to 10 parts by weight and more preferably from 0.1 part by weight to 5 parts by weight based on 100 parts by weight of a combination of the epoxy compound (i) and the compound (ii).

A polymerization solvent can be used for making the unsaturated-group-containing resin (A-1), if desired. Examples of the polymerization solvent include, but are not limited to, (1) alcohols, such as ethanol, propanol, iso-propanol, butanol, iso-butanol, 2-butanol, hexanol, ethylene glycol, and the like; (2) ketones, such as methyl ethyl ketone, cyclohexyl ketone, and the like; (3) aromatic hydrocarbons, such as toluene, xylene, and the like; (4) cellosolve compounds, such as cellosolve, butylcellosolve, and the like; (5) carbitol compounds, such as carbitol, butylcarbitol, and the like; (6) propylene glycol alkyl ethers, such as propylene glycol methyl ether, and the like; (7) poly(propylene glycol)alkyl ethers, such as di(propylene glycol) methyl ether, and the like; (8)acetates, such as ethyl acetate, butyl acetate, ethylene glycol monoethyl ether acetate, propylene glycol monomethyl ether acetate, and the like; (9) lactates, such as ethyl lactate, butyl lactate, and the like; and (10) dialkyl glycol ethers. The aforesaid examples of the polymerization solvent can be used alone or in combinations thereof.

The acid value of the unsaturated-group-containing resin (A-1) ranges preferably from 50 mgKOH/g to 200 mgKOH/g, and more preferably from 60 mgKOH/g to 150 mgKOH/g.

(A-2) Other Alkali-Soluble Resin:

In addition to the aforesaid alkali-soluble resin (A-1), the alkali-soluble resin (A) may include other alkali-soluble resin (A-2) different from the unsaturated-group-containing resin (A-1). The other alkali-soluble resin (A-2) is in an amount ranging generally from 0 to 70 parts by weight, preferably from 0 to 50 parts by weight, and more preferably from 0 to 30 parts by weight based on 100 parts by weight of the alkali-soluble resin (A).

Examples of the other alkali-soluble resin (A-2) include, but are not limited to, resins containing at least one carboxylic or hydroxyl group, such as acrylic resins other than the unsaturated-group-containing resin (A-1), urethane resins, novolac resins, and the like.

(B) Polysiloxane:

The polysiloxane (B) is in an amount ranging generally from 30 to 450 parts by weight, preferably from 40 to 430 parts by weight, and more preferably from 50 to 400 parts by weight based on 100 parts by weight of the alkali-soluble resin (A).

There is no specific limitation to the structure of the polysiloxane (B). Preferably, the polysiloxane (B) is obtained by subjecting a silane monomer, a siloxane prepolymer, or a combination of a silane monomer and a siloxane prepolymer to conduct hydrolysis and partial condensation.

The silane monomer is preferably represented by Formula (V):

$$SiR^{21}_m(OR^{22})_{4-m} \quad (V).$$

m is an integer ranging from 0 to 3.

$R^{21}$ represents hydrogen, a substituted or unsubstituted $C_1$-$C_{10}$ alkyl group, a substituted or unsubstituted $C_2$-$C_{10}$ alkenyl group, or a substituted or unsubstituted $C_6$-$C_{15}$ aryl group. A plurality of $R^{21}$'s are the same or different when m is 2 or 3. Examples of the alkyl group include, but are not limited to, methyl, ethyl, n-propyl, isopropyl, n-butyl, tert-butyl, n-hexyl, n-decyl, trifluoromethyl, 3,3,3-trifluoropropyl, 3-glycidoxy, 2-(3,4-epoxycyclohexyl)ethyl, 3-aminopropyl, 3-mercaptopropyl, 3-isocyanatopropyl, 2-oxetanylbutoxypropyl, 3-glutaric anhydride propyl, 3-succinic anhydride propyl, and 2-succinic anhydride ethyl. Examples of the alkenyl group include, but are not limited to, vinyl, 3-acryloyloxypropyl, and 3-methacryloyloxypropyl. Examples of the aryl group include, but are not limited to, phenyl, tolyl, p-hydroxyphenyl, 1-(p-hydroxyphenyl)ethyl, 2-(p-hydroxyphenyl)ethyl, 4-hydroxy-5-(p-hydroxyphenylcarbonyloxy)pentyl, and naphthyl.

$R^{22}$ represents hydrogen, a substituted or unsubstituted $C_1$-$C_6$ alkyl group, a substituted or unsubstituted $C_1$-$C_6$ acyl group, or a substituted or unsubstituted $C_6$-$C_{15}$ aryl group. A plurality of $R^{22}$'s are the same or different when 4-m is 2, 3, or 4. Examples of the alkyl group include, but are not limited to, methyl, ethyl, n-propyl, isopropyl, and n-butyl. A non-limiting example of the acyl group is acetyl. A non-limiting example of the aryl group is phenyl.

When m is 0, the silane monomer is tetrafunctional silane. When m is 1, the silane monomer is trifunctional silane. When m is 2, the silane monomer is difunctional silane. When m is 3, the silane monomer is monofunctional silane.

Examples of the silane monomer include, but are not limited to, (1) tetrafunctional silane: tetramethoxysilane, tetraethoxysilane, tetraacetoxysilane, tetraphenoxy silane, and the like; (2) trifunctional silane: methyltrimethoxysilane (MTMS), methyltriethoxysilane, methyltriisopropoxysilane, methyltri-n-butoxysilane, ethyltrimethoxysilane, ethyltriethoxysilane, ethyltriisopropoxysilane, ethyltri-n-butoxysilane, n-propyltrimethoxysilane, n-propyltriethoxysilane, n-butyltrimethoxysilane, n-butyltriethoxysilane, n-hexyltrimethoxysilane, n-hexyltriethoxysilane, decyltrimethoxysilane, vinyltrimethoxysilane, vinyltriethoxysilane, 3-acryloyloxypropyltrimethoxysilane, 3-acryloyloxypropyltriethoxysilane, 3-methacryloyloxypropyltrimethoxysilane, 3-methacryloyloxypropyltriethoxysilane, phenyltrimethoxysilane (PTMS), phenyltriethoxysilane (PTES), p-hydroxyphenyltrimethoxysilane, 1-(p-hydroxyphenyl)ethyltrimethoxysilane, 2-(p-hydroxyphenyl)ethyltrimethoxysilane, 4-hydroxy-5-(p-hydroxyphenylcarbonyloxy)pentyltrimethoxysilane, trifluoromethyltrimethoxysilane, trifluoromethyltriethoxysilane, 3,3,3-trifluoropropyltrimethoxysilane, 3-aminopropyltrimethoxysilane, 3-aminopropyltriethoxysilane, 3-glycidoxypropyltrimethoxysilane, 3-glycidoxypropyltriethoxysilane, 2-(3,4-epoxycyclohexyl)ethyltrimethoxysilane, 3-mercaptopropyltrimethoxysilane, 2-oxetanylbutoxypropyltriphenoxysilane, commercially available 2-oxetanylbutoxypropyltrimethoxysilane manufactured by Toagosei (trade name: TMSOX), commercially available 2-oxetanylbutoxypropyltriethoxysilane manufactured by Toagosei (trade name: TESOX), 2-trimethoxysilylethyl succinic anhydride, 3-triphenoxysilylpropyl succinic anhydride, commercially available 3-trimethoxysilylpropyl succinic anhydride manufactured by Shin-Etsu (trade name: X-12-967), commercially available 3-triethoxysilylpropyl succinic anhydride manufactured by WACKER (trade name: GF-20), 3-trimethoxysilylpropyl glutaric anhydride (TMSG), 3-triethoxysilylpropyl glutaric anhydride, 3-triphenoxysilylpropyl glutaric anhydride, and the like; (3) difunctional silane: dimethyldimethoxysilane (DMDMS), dimethyldiethoxysilane, dimethyldiacetyloxysilane, di-n-butyldmethoxysilane, diphenyldimethoxysilane, diisopropoxy-di(2-oxetanylbutoxypropyl)silane (DIDOS), di(3-oxetanylpentyl)dimethoxysilane, di-[(2-succinic anhydride)propyl]di-n-butoxysilane, di-[(2-Succinic anhydride) ethyl]dimethoxysilane, and the like; and (4) monofunctional silane: trimethylmethoxysilane, tri-n-butylethoxysilane, 3-glycidoxydimethylmethoxysilane, 3-glycidoxydimethylethoxysilane, tri-[(2-succinic anhydride)propyl]phenoxysilane, di-[(2-succinic anhydride)ethyl](methyl)methoxysilane, and the like. The aforesaid examples of the silane monomer can be used alone or in combinations thereof.

The siloxane prepolymer is preferably represented by Formula (VI):

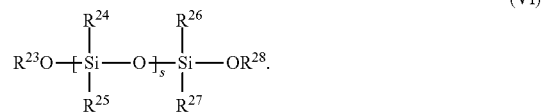

s is an integer ranging from 1 to 1,000 and preferably from 5 to 200.

$R^{24}$, $R^{25}$, $R^{26}$, and $R^{27}$ respectively represent hydrogen, a substituted or unsubstituted $C_1$-$C_{10}$ alkyl group, a substituted or unsubstituted $C_7$-$C_6$ alkenyl group, or a substituted or unsubstituted $C_6$-$C_{15}$ aryl group. A plurality of $R^{24}$'s are the same or different and a plurality of $R^{25}$'s are the same or different when s is from 2 to 1,000. Examples of the alkyl group include, but are not limited to, methyl, ethyl, and n-propyl. Examples of the alkenyl group include, but are not limited to, vinyl, acryloyloxypropyl, and methacryloyloxypropyl. Examples of the aryl group include, but are not limited to, phenyl, tolyl, and naphthyl.

$R^{23}$ and $R^{28}$ respectively represent hydrogen, a substituted or unsubstituted $C_1$-$C_6$ alkyl group, a substituted or unsubstituted $C_1$-$C_6$ acyl group, or a substituted or unsubstituted $C_6$-$C_{15}$ aryl group. Examples of the alkyl group include, but are not limited to, methyl, ethyl, n-propyl, isopropyl, and n-butyl. A non-limiting example of the acyl group is acetyl. A non-limiting example of the aryl group is phenyl.

Examples of the siloxane prepolymer include, but are not limited to, 1,1,3,3-tetramethyl-1,3-dimethoxydisiloxane, 1,1,3,3-tetramethyl-1,3-diethoxydisiloxane, 1,1,3,3-tetraethyl-1,3-diethoxydisiloxane, and commercially available silanol terminated polysiloxanes manufactured by Gelest Inc. (for example, DM-S12 (molecular weight: 400-700), DMS-S15 (molecular weight: 1,500-2,000), DMS-S21 (molecular weight: 4,200), DMS-S27 (molecular weight: 18,000), DMS-S31 (molecular weight: 26,000), DMS-S32 (molecular weight: 36,000), DMS-S33 (molecular weight: 43,500), DMS-S35 (molecular weight: 49,000), DMS-S38 (molecular weight: 58,000), DMS-S42 (molecular weight: 77,000), PDS-9931 (molecular weight: 1,000-1,400), and the like). The aforesaid examples of the siloxane prepolymer can be used alone or in combinations thereof.

When the silane monomer and the siloxane prepolymer are used in combination, there is no specific limitation to the mixing ratio thereof. Preferably, the molar ratio of the Si atom of the silane monomer to that of the siloxane prepolymer ranges from 100:0.01 to 50:50.

Alternatively, polysiloxane can be prepared via copolymerization by mixing the silane monomer and/or siloxane prepolymer with silicon dioxide particles. There is no specific limitation to the mean particle size of the silicon dioxide particles. The mean particle size of the silicon dioxide particles ranges generally from 2 nm to 250 nm, preferably from 5 nm to 200 nm, and more preferably from 10 nm to 100 nm.

Examples of the silicon dioxide particles include commercially available products manufactured by Catalysts and Chemicals Ltd., for example, OSCAR 1132 (particle size: 12 nm, dispersing agent: methanol), OSCAR 1332 (particle size: 12 nm, dispersing agent: n-propanol), OSCAR 105 (particle size: 60 nm, dispersing agent: γ-butyrolactone), OSCAR 106 (particle size: 120 nm, dispersing agent: diacetone alcohol), and the like; commercially available products manufactured by Fuso Chemical Co., Ltd., for example, Quartron PL-1-IPA (particle size: 13 nm, dispersing agent: isopropanone), Quartron PL-1-TOL (particle size: 13 nm, dispersing agent: phenol), Quartron PL-2L-PGME (particle size: 18 nm, dispersing agent: propylene glycol monomethyl ether), Quartron PL-2L-MEK (particle size: 18 nm, dispersing agent: methyl ethyl ketone), and the like; commercially available products manufactured Nissan Chemical, for example, IPA-ST (particle size: 12 nm, dispersing agent: isopropanol), EG-ST (particle size: 12 nm, dispersing agent: ethylene glycol), IPA-ST-L (particle size: 45 nm, dispersing agent: isopropanol), IPA-ST-ZL (particle size: 100 nm, dispersing agent: isopropanol), and the like. The aforesaid examples of the silicon dioxide particles can be used alone or in combinations thereof.

When the silicon dioxide particles are mixed with the silane monomer and/or the siloxane prepolymer, there is no specific limitation to the amounts thereof. Preferably, the molar ratio of the Si atom of the silicon dioxide particles to that of the silane monomer and/or the siloxane prepolymer ranges from 1% to 50%.

The hydrolysis and the partial condensation can be conducted in a manner well known in the art. For example, the mixture of the silane monomer and/or the siloxane prepolymer and/or the silicon dioxide particles is added with solvent, water, and optionally catalyst, followed by stirring at a temperature ranging from 50 to 150° C. for 0.5 to 120 hours. The by-products, such as alcohols and water, can be removed by distillation if necessary.

There is no specific limitation to the solvent, which can be the same as or different from the solvent (F) contained in the photosensitive resin composition. Preferably, the solvent is added in an amount ranging generally from 15 g to 1200 g, preferably from 20 g to 1100 g, and more preferably from 30 g to 1000 g based on 100 g of a combination of the silane monomer and the siloxane prepolymer.

The amount of water for the hydrolysis ranges from 0.5 to 2 moles based on 1 mole of the hydrolysable groups contained in the mixture. There is no specific limitation to the catalyst. Preferably, the examples of the catalyst include acidic catalyst, for example, hydrochloric acid, nitric acid, sulfuric acid, hydrofluoric acid, oxalic acid, phosphoric acid, acetic acid, trifluoroacetic acid, formic acid, polycarboxylic acid and anhydride thereof, ionic exchange resin, and the like; and basic catalyst, for example, diethylamine, triethylamine, tripropylamine, tributylamine, tripentylamine, trihexylamine, triheptylamine, trioctylamine, diethanolamine, triethanolamine, sodium hydroxide, potassium hydroxide, alkoxysilane containing an amino group, ionic exchange resin, and the like.

Preferably, the catalyst is added in an amount ranging generally from 0.005 g to 15 g, preferably from 0.01 g to 12 g, and more preferably from 0.05 g to 10 g based on 100 g of a combination of the silane monomer and the siloxane prepolymer.

In view of safety, it is preferable that the by-products (for example, alcohols or water) and the catalyst are not contained in the polysiloxane (B) produced by the hydrolysis and the partial condensation. Therefore, it is preferable to purify the polysiloxane (B). There is no specific limitation to the purification method. Preferably, the polysiloxane (B) is diluted with hydrophobic solvent, and the separated organic layer is washed several times with water and is then condensed with an evaporator to remove alcohols and water. Alternatively, the catalyst can be removed using ion exchange resin.

(C) Ethylenically Unsaturated Compound:

The ethylenically unsaturated compound (C) is in an amount ranging generally from 5 to 220 parts by weight, preferably from 10 to 200 parts by weight, and more preferably from 15 to 180 parts by weight based on 100 parts by weight of the alkali-soluble resin (A).

Preferably, the ethylenically unsaturated compound (C) is selected from (C-1) a compound having one ethylenically unsaturated group, or (C-2) a compound having two or more ethylenically unsaturated groups.

Examples of the compound (C-1) include, but are not limited to, acrylamide, (meth)acryloylmorpholine, 7-amino-3,7-dimethyloctyl(meth)acrylate, iso-butoxymethyl(meth)acrylamide, iso-bornyloxyethyl(meth)acrylate, iso-bornyl(meth)

acrylate, 2-ethylhexyl(meth)acrylate, ethyl diethylene glycol (meth)acrylate, t-octyl(meth)acrylamide, diacetone(meth) acrylamide, dimethylaminoethyl(meth)acrylate, dodecyl (meth)acrylate, dicyclopentenyloxyethyl(meth)acrylate, dicyclopentenyl(meth)acrylate, N,N-dimethyl(meth)acrylamide, tetrachlorophenyl(meth)acrylate, 2-tetrachlorophenoxy ethyl(meth)acrylate, tetrahydrofurfuryl(meth)acrylate, tetrabromophenyl(meth)acrylate, 2-tetrabromophenoxyethyl (meth)acrylate, 2-trichlorophenoxyethyl(meth)acrylate, tribromophenyl(meth)acrylate, 2-tribromophenoxyethyl(meth) acrylate, 2-hydroxyethyl(meth)acrylate, 2-hydroxypropyl (meth)acrylate, vinylcaprolactam, N-vinylpyrrolidone, phenoxyethyl(meth)acrylate, pentachlorophenyl(meth)acrylate, pentabromophenyl(meth)acrylate, polyethylene glycol mono(meth)acrylate, polypropylene glycol mono(meth) acrylate, and bornyl(meth)acrylate. The aforesaid examples of the compound (C-1) can be used alone or in admixture of two or more.

Examples of the compound (C-2) include, but are not limited to, ethylene glycol di(meth)acrylate, dicyclopentenyl di(meth)acrylate, triethylene glycol di(meth)acrylate, tetraethylene glycol di(meth)acrylate, tri(2-hydroxyethyl) isocyanurate di(meth)acrylate, tri(2-hydroxyethyl) isocyanurate tri (meth)acrylate, caprolactone-modified tri(2-hydroxyethyl) isocyanurate tri(meth)acrylate, trimethylolpropyl tri(meth) acrylate, ethylene oxide (hereinafter abbreviated as EO) modified trimethylolpropyl tri(meth)acrylate, propylene oxide (hereinafter abbreviated as PO) modified trimethylolpropyl tri(meth)acrylate, tripropylene glycol di(meth)acrylate, neo-pentyl glycol di(meth)acrylate, 1,4-butanediol di(meth)acrylate, 1,6-hexanediol di(meth)acrylate, pentaerythritol tri(meth)acrylate, pentaerythritol tetra(meth) acrylate, polyester di(meth)acrylate, polyethylene glycol di(meth)acrylate, dipentaerythritol hexa(meth)acrylate, dipentaerythritol penta(meth)acrylate, dipentaerythritol tetra (meth)acrylate, caprolactone-modified dipentaerythritol hexa(meth)acrylate, caprolactone-modified dipentaerythritol penta(meth)acrylate, ditrimethylolpropyl tetra(meth)acrylate, EO-modified bisphenol A di(meth)acrylate, PO-modified bisphenol A di(meth)acrylate, EO-modified hydrogenated bisphenol A di(meth)acrylate, PO-modified hydrogenated bisphenol A di(meth)acrylate, PO-modified glycerol tri(meth)acrylate, EO-modified bisphenol F di(meth)acrylate, and phenol novolac polyglycidyl ether (meth)acrylate. The aforesaid examples of the compound (C-2) can be used alone or in admixture of two or more.

Preferably, the ethylenically unsaturated compound (C) is selected from trimethylolpropyl triacrylate, EO-modified trimethylolpropyl triacrylate, PO-modified trimethylolpropyl triacrylate, pentaerythritol triacrylate, pentaerythritol tetraacrylate, dipentaerythritol hexaacrylate, dipentaerythritol pentaacrylate, dipentaerythritol tetraacrylate, caprolactone-modified dipentaerythritol hexaacrylate, ditrimethylolpropyl tetraacrylate, PO-modified glycerol triacrylate, and combinations thereof.

(D) Photo-Initiator:

The photo-initiator (D) is in an amount ranging generally from 2 to 120 parts by weight, more preferably from 5 to 70 parts by weight, and more preferably from 10 to 60 parts by weight based on 100 parts by weight of the ethylenically unsaturated compound (C).

Examples of the photo-initiator (D) suitable for the present invention include, but are not limited to, oxime compounds (D-1), acetophenone compounds (D-2), other photo-initiators (D-3), and combinations thereof.

Examples of the oxime compounds (D-1) include, but are not limited to, ethanone, 1-[9-ethyl-6-(2-methylbenzoyl)9H-carbazole-3-yl]-,1-(O-acetyl oxime) (for example, OXE02 manufactured by Ciba Specialty Chemicals), ethanone, 1-[9-ethyl-6-(2-chloro-4-benzylsulfonyl benzoyl)9H-carbazole-3-yl]-1-(O-acetyl oxime) (manufactured by Asahi Denka Co., Ltd.), 1-(4-phenyl-thiophenyl)-butane-1,2-dione 2-oxime-O-benzoate, 1-(4-phenyl-thiophenyl)-octane-1,2-dione 2-oxime-O-benzoate (for example, OXE01 manufactured by Ciba Specialty Chemicals), 1-(4-phenyl-thiophenyl)-octane-1-one oxime-O-acetate, and 1-(4-phenyl-thiophenyl)-butane-1-one oxime-O-acetate. The aforesaid examples of the oxime compounds (D-1) can be used alone or in combinations thereof. Preferably, the oxime compounds (D-1) is selected from ethanone, 1-[9-ethyl-6-(2-methylbenzoyl)9H-carbazole-3-yl]-,1-(O-acetyl oxime) and 1-(4-phenyl-thiophenyl)-octane-1,2-dione 2-oxime-O-benzoate.

Examples of the acetophenone compounds (D-2) include, but are not limited to, p-dimethylaminoacetophenone, α,α'-dimethoxyazoxyacetophenone, 2,2'-dimethyl-2-phenylacetophenone, p-methoxyacetophenone, 2-methyl-1-(4-methylthiophenyl)-2-morpholino-1-propanone, and 2-benzyl-2-N,N-dimethylamino-1-(4-morpholinophenyl)-1-butanone. The aforesaid examples of the acetophenone compounds (D-2) can be used alone or in combinations thereof. Preferably, the acetophenone compound (D-2) is selected from 2-methyl-1-(4-methylthiophenyl)-2-morpholino-1-propanone and 2-benzyl-2-N,N-dimethylamino-1-(4-morpholinophenyl)-1-butanone.

Examples of other photo-initiators (D-3) include, but are not limited to, (1) biimidazole compounds: 2,2'-bis(o-chlorophenyl)-4,4',5,5'-tetraphenylbiimidazole, 2,2'-bis(o-fluorophenyl)-4,4',5,5'-tetraphenylbiimidazole, 2,2'-bis(o-methylphenyl)-4,4',5,5'-tetraphenylbiimidazole, 2,2'-bis(o-methoxyphenyl)-4,4',5,5'-tetraphenylbiimidazole, 2,2'-bis (p-methylphenyl)-4,4',5,5'-tetraphenylbiimidazole, 2,2'-bis (2,2',4,4'-tetramethoxyphenyl)-4,4',5,5'-tetraphenylbiimidazole, 2,2'-bis(2,4-dichlorophenyl)-4,4',5,5'-tetraphenylbiimidazole, and the like; (2) benzophenone compounds: thioxanthone, 2,4-diethylthioxanthone, thioxanthone-4-sulfone, benzophenone, 4,4'-bis(dimethylamino) benzophenone, 4,4'-bis(diethylamino)benzophenone, and the like; (3) α-diketone compounds: benzil, acetyl, and the like; (4) acyloin compounds: benzoin, and the like; (5) acyloin ether compounds: benzoin methyl ether, benzoin ethyl ether, benzoin isopropyl ether, and the like; (6) acylphosphine oxide compounds: 2,4,6-trimethylbenzoyl diphenyl phosphine oxide, bis-(2,6-dimethoxybenzoyl)-2,4,4-trimethyl benzyl phosphine oxide, and the like; (7) quinone compounds: anthraquinone, 1,4-naphthoquinone, and the like; (8) halide compounds, such as phenacyl chloride, tribromomethyl phenylsulfone, tris(trichloromethyl)-s-triazine, and the like; (9) peroxide compounds: di-tert-butyl peroxide; and the like; and (10) any combinations of the aforesaid compounds (1)-(9). The aforesaid examples of other photo-initiators (D-3) can be used alone or in combinations thereof.

(E) Black Pigment:

The black pigment (E) is in an amount ranging generally from 30 to 500 parts by weight, preferably from 40 to 450 parts by weight, and more preferably from 50 to 400 parts by weight based on 100 parts by weight of the alkali-soluble resin (A).

The black pigment (E) used in the present invention is desired to have good properties including heat resistance, light resistance and solvent resistance. Examples of the black pigment (E) include, but are not limited to, (1) organic black pigment: perylene black, cyanine black, aniline black, and the like; (2) a black-like admixture of two or more pigments selected from red, blue, green, purple, yellow, cyanine, magenta and the like; and (3) inorganic black pigment, such as carbon black, chromium oxide, ferric oxide, titanium black, and graphite. The aforesaid examples of the black pigment (E) can be used alone or in combinations thereof. A non-limiting example of carbon black is C.I. pigment black 7. Commercially available examples of carbon black include MA100, MA230, MA8, #970, #1000, #2350, and #2650 manufactured by Mitsubishi Chemical Corporation.

(F) Solvent:

There is no specific limitation to the solvent suitable in the photosensitive resin composition of the present invention as long as it can dissolve the alkali-soluble resin (A), the polysiloxane (B), the ethylenically unsaturated compound (C), and the photo-initiator (D) and it will not interact with these components. The solvent is preferably volatile.

The solvent (F) is in an amount ranging generally from 500 to 5,000 parts by weight, preferably from 800 to 4,700 parts by weight, and more preferably from 1,000 to 4,500 parts by weight based on 100 parts by weight of the alkali-soluble resin (A).

Examples of the solvent (F) include, but are not limited to, (1) alkylene glycol monoalkyl ether compounds: ethylene glycol monomethyl ether, ethylene glycol monoethyl ether, diethylene glycol monoethyl ether, diethylene glycol mono-n-propyl ether, diethylene glycol mono-n-butyl ether, triethylene glycol monomethyl ether, triethylene glycol monoethyl ether, propylene glycol monomethyl ether, propylene glycol monoethyl ether, dipropylene glycol monomethyl ether, dipropylene glycol monoethyl ether, dipropylene glycol mono-n-propyl ether, dipropylene glycol mono-n-butyl ether, tripropylene glycol monomethyl ether, tripropylene glycol monoethyl ether, and the like; (2) alkylene glycol monoalkyl ether acetate compounds: ethylene glycol monomethyl ether acetate, ethylene glycol monoethyl ether acetate, propylene glycol monomethyl ether acetate, propylene glycol monoethyl ether acetate, and the like; (3) other ether compounds: diethylene glycol dimethyl ether, diethylene glycol methyl ethyl ether, diethylene glycol diethyl ether, tetrahydrofuran, and the like; (4) ketone compounds: methyl ethyl ketone, cyclohexanone, 2-heptanone, 3-heptanone, diacetone alcohol, and the like; (5) alkyl lactate compounds: methyl 2-hydroxypropionate, ethyl 2-hydroxypropionate, and the like; (6) other ester compounds: methyl 2-hydroxy-2-methylpropionate, ethyl 2-hydroxy-2-methylpropionate, methyl 3-methoxypropionate, ethyl 3-methoxypropionate, methyl 3-ethoxypropionate, ethyl 3-ethoxypropionate, ethyl ethoxyacetate, ethyl hydroxyacetate, methyl 2-hydroxy-3-methylbutyrate, 3-methyl-3-methoxybutyl acetate, 3-methyl-3-methoxybutylpropionate, ethyl acetate, n-propyl acetate, i-propyl acetate, n-butyl acetate, i-butyl acetate, n-pentyl acetate, i-pentyl acetate, n-butyl propionate, ethyl butyrate, n-propyl butyrate, i-propyl butyrate, n-butyl butyrate, methylpyrutate, ethyl pyrutate, n-propyl pyrutate, methyl acetoacetate, ethyl acetoacetate, ethyl 2-oxybutyrate, and the like; (7) aromatic hydrocarbon compounds: toluene, xylene, and the like; (8) carboxylic amine compounds: N-methylpyrrolidone, N,N-dimethylformamide, N,N-dimethylacetamide, and the like; and (9) any combinations of the aforesaid compounds (1)-(8). The aforesaid examples of the solvent (F) can be used alone or in combinations thereof.

(G) Additives:

Additives (G) commonly used in the art can be optionally added to the photosensitive resin composition of the present invention as long as the desirable effects of the present invention are not affected. Examples of the additives (G) include, but are not limited to, a surfactant, a filler, an adhesion promoting agent, a cross-linking agent, an antioxidant, a UV absorbent, an anti-coagulant, and a polymer other than the alkali-soluble resin (A) to enhance properties such as mechanical property.

If used, the filler, the adhesion promoting agent, the antioxidant, the UV absorbent, the anti-coagulant, and the polymer other than the alkali-soluble resin (A) are respectively in an amount preferably less than 10 parts by weight and more preferably less than 6 parts by weight based on 100 parts by weight of the alkali-soluble resin (A).

If used, the surfactant is in an amount preferably less than 6 parts by weight and more preferably less than 4 parts by weight based on 100 parts by weight of the alkali-soluble resin (A).

If used, the cross-linking agent is in an amount preferably less than 100 parts by weight and more preferably less than 80 parts by weight based on 100 parts by weight of the alkali-soluble resin (A).

Preferably, the surfactant is selected from a cationic surfactant, an anionic surfactant, a nonionic surfactant, an amphoteric surfactant, a silicone-based surfactant, a fluorine-based surfactant, and combinations thereof. Examples of the surfactant include, but are not limited to, (1) polyoxyethylene alkyl ethers: polyoxyethylene lauryl ether, polyoxyethylene stearyl ether, polyoxyethylene oleyl ether, and the like; (2) polyoxyethylene alkyl phenyl ethers: polyoxyethylene octyl phenyl ether, polyoxyethylene nonyl phenyl ether, and the like; (3) polyethylene glycol dialkyl esters: polyethylene glycol dilaurate, polyethylene glycol distearate, and the like; (4) sorbitan fatty acid esters; (5) fatty acid modified polyesters; and (6) tertiary amine modified polyurethanes. The aforesaid examples of the surfactant can be used alone or in combinations thereof.

Commercially available examples of the surfactant include, but are not limited to, KP manufactured by Shin-Etsu Chemical Industry Co., Ltd., SF-8427 manufactured by Toray Dow Corning Silicon, Polyflow manufactured by Kyoei-Sha Yushi Kagaku Kogyo Co., Ltd., F-Top manufactured by Tochem Product Co., Ltd., Megafac manufactured by Dainippon Chemicals and Ink Co., Ltd., Fluorade manufactured by Sumitomo 3M Co., Ltd., Asahi Guard, Serflon manufactured by Asahi Glass Co., Ltd., and SINOPOL E8008 manufactured by Sino-Japan Chenucal.

Examples of the filler include, but are not limited to, glass and alumina.

Examples of the adhesion-promoting agent include, but are not limited to, vinyltrimethoxysilane, vinyltriethoxysilane, vinyltris(2-methoxyethoxy)silane, N-(2-aminoethyl)-3-aminopropylmethyldimethoxysilane, N-(2-aminoethyl)-3-aminopropyltrimethoxysilane, 3-aminopropyltriethoxysilane, 3-glycidyloxy propyltrimethoxysilane, 3-glycidyloxypropylmethyldimethoxysilane, 2-(3,4-epoxycyclohexyl)ethyltrimethoxysilane, 3-chloropropylmethyl dimethoxysilane, 3-chloropropyltrimethoxysilane, 3-methacryloyloxypropyltrimethoxysilane, and 3-mercaptopropyltrimethoxysilane.

Examples of the antioxidant include, but are not limited to, 2,2-thiobis(4-methyl-6-t-butylphenol) and 2,6-di-t-butylphenol.

Examples of the UV absorbent include, but are not limited to, 2-(3-t-butyl-5-methyl-2-hydroxyphenyl)-5-chlorobenzotriazole, and alkoxybenzophenone.

A non-limiting example of the anti-coagulant is sodium polyacrylate.

Examples of the cross-linking agent include, but are not limited to, epoxy compounds or resins, such as 1031S, 157S-70, and the like manufactured by Japan Epoxy Resins Co., Ltd.

Black Matrix and Preparation Thereof:

The black matrix is made by applying the photosensitive resin composition of the present invention on a substrate, followed by prebaking, exposing, developing, and postbaking. The black matrix thus made has an optical density larger than 3.0, preferably from 3.2 to 5.5 and more preferably from 3.5 to 5.5 when the black matrix has a film thickness of 1 μm.

Specifically, the black matrix is made as follows. The photosensitive resin composition is applied on a substrate by spin coating, slit coating, and the like, and is then dried under reduced pressure or prebaked to remove the solvent and to form a prebaked coating film on the substrate. The conditions for the drying under reduced pressure or the prebaking depend on the type and the formulating ratio of the components for the photosensitive resin composition. However, the drying under reduced pressure is usually conducted at a pressure less than 200 mmHg for a period ranging from 1 to 20 seconds, and the prebaking is usually conducted at a temperature ranging from 70 to 110° C. for a period ranging from 1 to 15 minutes. The prebaked coating film is exposed via a photomask using ultraviolet light, such as g-line, h-line, i-line, and the like. The device for providing the ultraviolet light includes a (ultra-) high pressure mercury lamp, or a metal halide lamp. The prebaked coating film after exposing is immersed in a developer solution at a temperature of 23±2° C. for a period ranging from 15 seconds to 5 minutes so as to form a desired pattern. Examples of the developer include, but are not limited to, alkali compounds, such as sodium hydroxide, potassium hydroxide, sodium carbonate, sodium hydrogen carbonate, potassium carbonate, potassium hydrogen carbonate, sodium silicate, sodium methylsilicate, aqueous ammonia, ethylamine, diethylamine, dimethyl ethanolamine, tetramethylammonium hydroxide, tetraethylammonium hydroxide, choline, pyrrole, piperidine, and 1,8-diazabicyclo-[5,4,0]-7-undecene. The concentration of the developer solution ranges preferably from 0.001 to 10 wt %, more preferably from 0.005 to 5 wt %, and most preferably from 0.01 to 1 wt %.

The developer is removed by washing with water after the development. The coating film formed on the substrate is dried with compressed air or nitrogen, and is then post-baked using a heating device, such as a hot plate or an oven. The post-baking is conducted at a temperature ranging from 150 to 250° C. for a period ranging from 1 to 60 minutes if the hot plate is used or for a period ranging from 5 to 90 minutes if the oven is used. A black matrix is formed on the substrate after the aforementioned process.

Examples of the substrate suitable for the present invention include alkali-free glass, soda-lime glass, Pyrex glass, quartz glass, a glass coated with a transparent conductive film thereon, and the like commonly used in a liquid crystal display; or a photoelectric conversion substrate (for example, a silicon substrate) used in a solid-state image sensor.

Color Filter and Preparation Thereof:

The color filter includes the aforesaid black matrix, and can be made in a manner commonly used in the art. For example, the aforesaid black matrix is formed on a substrate. Red, green, and blue filter segments are then formed on the substrate in the same manner as that for forming the black matrix so as to form a pixel color layer. An ITO (indium tin oxide) film was deposited on the pixel color layer at a temperature ranging from 220 to 250° C. under vacuum. The ITO film can be etched and formed with a wiring layout, if necessary. A liquid crystal alignment agent containing polyimide was then applied to form a liquid crystal alignment film. A color filter for a liquid crystal display was thus obtained.

Liquid Crystal Display and Preparation Thereof:

The liquid crystal display includes the aforesaid color filter, and can be made in a manner commonly used in the art. For example, the substrate formed with the color filter and a substrate formed with a thin film transistor were arranged to oppose each other with a space (cell gap). The peripheral portions of the two substrates were joined together with a sealing agent, liquid crystals were filled into the cell gap defined by the surfaces of the substrates and the sealing agent, and an injection hole was sealed up to form a liquid crystal cell. Then, a polarizer was affixed to the exterior sides of the liquid crystal cell to obtain the liquid crystal display device.

The following examples are provided to illustrate the preferred embodiments of the invention, and should not be construed as limiting the scope of the invention.

EXAMPLES

Preparation of Unsaturated-Group-Containing Resin (A-1)

Synthesis Example 1

A 500 ml four-necked flask was added with fluorene epoxy compound (ESF-300 manufactured by Nippon Steel Chemical Co., epoxy equivalent: 231, 100 parts by weight), acrylic acid (30 parts by weight), benzyltriethylammonium chloride (0.3 part by weight), 2,6-di-t-butyl-p-cresol (0.1 part by weight), and propylene glycol monomethyl ether acetate (130 parts by weight) at a controlled feeding rate of 25 parts by weight/min in a continuous manner. A reaction was conducted at a temperature ranging from 100 to 110° C. for a period of 15 hours to obtain a yellowish transparent mixture having a solid concentration of 50 wt %.

The yellowish transparent mixture (100 parts by weight) was dissolved in ethylene glycol monoethyl ether acetate (25 parts by weight) while added with tetrahydrophthalic anhydride (6 parts by weight) and benzophenone tetracarboxylic dianhydride (13 parts by weight). A reaction was conducted by heating at a temperature ranging from 110 to 115° C. for a period of 2 hours. An unsaturated-group-containing resin (A-1-1) was obtained, which has an acid value of 98.0 mgKOH/g.

Synthesis Example 2

A 500 ml four-necked flask was added with fluorene epoxy compound (ESF-300 manufactured by Nippon Steel Chemical Co., epoxy equivalent: 231, 100 parts by weight), acrylic acid (30 parts by weight), benzyltriethylammonium chloride (0.3 part by weight), 2,6-di-t-butyl-p-cresol (0.1 part by weight), and propylene glycol monomethyl ether acetate (130 parts by weight) at a controlled feeding rate of 25 parts by weight/min in a continuous manner. A reaction was conducted at a temperature ranging from 100 to 110° C. for a period of 15 hours to obtain a yellowish transparent mixture having a solid concentration of 50 wt %.

The yellowish transparent mixture (100 parts by weight) was dissolved in ethylene glycol monoethyl ether acetate (25 parts by weight) while added with benzophenone tetracarboxylic dianhydride (13 parts by weight). A reaction was conducted by heating at a temperature ranging from 90 to 95° C. for a period of 2 hours. Tetrahydrophthalic anhydride (6 parts by weight) was then added. A further reaction was conducted at a temperature ranging from 90 to 95° C. for a period of 4 hours. An unsaturated-group-containing resin (A-1-2) was obtained, which has an acid value of 99.0 mgKOH/g.

Synthesis Example 3

An epoxy compound (NC-3000 manufactured by Nippon Kayaku Co. Ltd., epoxy equivalent: 288, 400 parts by weight), acrylic acid (102 parts by weight), p-methoxyphenol (0.3 part by weight), triphenyl phosphine (5 parts by weight), and propylene glycol monomethyl ether acetate (264 parts by weight) were reacted in a reactor at a temperature of 95° C. for a period of 9 hours to obtain an intermediate product having an acid value of 2.2 mgLOH/g. Tetrahydrophthalic anhydride (151 parts by weight) was then added. A further reaction was conducted at a temperature of 95° C. for a period of 4 hours. An unsaturated-group-containing resin (A-1-3) was obtained, which has an acid value of 102 mgKOH/g and a weight average molecular weight of 3,200.

Preparation of Other Alkali-Soluble Resin (A-2)

Synthesis Example 4

A round-bottomed flask installed with a stirrer and a condenser and purged with nitrogen was added with 2,2'-azobisisobutyronitrile (1 part by weight), propylene glycol monomethyl ether acetate (240 parts by weight), methacrylic acid (20 parts by weight), styrene (15 parts by weight), benzoyl methacrylate (35 parts by weigh), glyceryl monomethytl acrylate (10 parts by weight), and N-phenyl maleimide (20 parts by weight). The temperature was raised to 80° C. with slow stirring to obtain a homogeneous mixture. A polymerization reaction was conducted for a period of 4 hours. The temperature was further raised to 100° C., and additional 2,2'-azobisisobutyronitrile (0.5 part by weight) was added. A further polymerization reaction was conducted for a period of 1 hour to obtain an alkali-soluble resin (A-2-1).

Synthesis Example 5

A round-bottomed flask installed with a stirrer and a condenser and purged with nitrogen was added with 2,2'-azobisisobutyronitrile (2 parts by weight), propylene glycol monomethyl ether (300 parts by weight), methacrylic acid (15 parts by weight), 2-hydroxyethyl acetate (15 parts by weight), and benzoyl methacrylate (70 parts by weigh). The temperature was raised to 80° C. with slow stirring to obtain a homogeneous mixture. A polymerization reaction was conducted for a period of 3 hours. The temperature was further raised to 100° C., and additional 2,2'-azobisisobutyronitrile (0.5 part by weight) was added. A further polymerization reaction was conducted for a period of 1 hour to obtain an alkali-soluble resin (A-2-2).

Preparation of Polysiloxane (B)

Synthesis Example 6

A 500 ml three-necked flask was added with propylene glycol monoethyl ether (100 g). Stirring was conducted at room temperature while a solution of a silane monomer mixture and an oxalic acid aqueous solution were continuously added. The solution of the silane monomer mixture was prepared by dissolving dimethyldimethoxysilane (84 g, 0.7 mole) and phenyltrimethoxysilane (59.4 g, 0.3 mole) in propylene glycol monoethyl ether (80 g). The oxalic acid aqueous solution was prepared by dissolving oxalic acid (0.15 g) in water (30 g). The mixture in the flask was then stirred in an oil bath at a temperature of 30° C. for 30 minutes. The temperature of the oil bath was raised to 120° C. within a succeeding 30 minutes until the temperature of the mixture in the flask reached 105° C. The mixture in the flask was stirred for a further 2 hours to obtain polysiloxane (B-1) via polycondensation. Methanol (73 g) and water (16 g) produced as by-products were separated by distillation.

Synthesis Example 7

A 500 ml three-necked flask was added with dimethyldimethoxysilane (78.0 g, 0.65 mole), phenyltrimethoxysilane (63.4 g, 0.32 mole), 3-triethoxysilylpropyl succinic anhydride (GF-20 (a trade name), 9.1 g, 0.03 mole), and propylene glycol monoethyl ether (200 g). Stirring was conducted at room temperature while an oxalic acid aqueous solution (0.25 g oxalic acid/75 g $H_2O$) was added over 30 minutes. The mixture in the flask was then stirred in an oil bath at a temperature of 30° C. for 30 minutes. The temperature of the oil bath was raised to 120° C. within a succeeding 30 minutes until the temperature of the mixture in the flask reached 100° C. The mixture in the flask was stirred for a further 5 hours to conduct polycondensation. The reaction solution in the flask was cooled to room temperature. Acetone (2,000 g) was added and the solution in the flask was stirred for a further 30 minutes. Precipitate was removed from the solution via filtration to obtain a filtrate. The solvent contained in the filtrate was removed via distillation to obtain polysiloxane (B-2).

Synthesis Example 8

A 500 ml three-necked flask was added with propylene glycol monoethyl ether (100 g). Stirring was conducted at room temperature while a solution of a silane monomer mixture and an oxalic acid aqueous solution were continuously added. The solution of the silane monomer mixture was prepared by dissolving methyltrimethoxysilane (81.6 g, 0.6 mole) and phenyltrimethoxysilane (79.2 g, 0.4 mole) in propylene glycol monoethyl ether (80 g). The oxalic acid aqueous solution was prepared by dissolving oxalic acid (0.1 g) in water (30 g). The mixture in the flask was then stirred in an oil bath at a temperature of 30° C. for 30 minutes. The temperature of the oil bath was raised to 120° C. within a succeeding 30 minutes until the temperature of the mixture in the flask reached 105° C. The mixture in the flask was stirred for a further 2 hours to obtain polysiloxane (B-3) via polycondensation. Methanol (96 g) and water (25 g) produced as by-products were separated by distillation.

Preparation of Photosensitive Resin Composition

Example 1

100 parts by weight of the unsaturated-group-containing resin (A-1-1) obtained in Synthesis Example 1, 70 parts by weight of the polysiloxane (B-1) obtained in Synthesis Example 6, 100 parts by weight of dipentaerythritol hexaacrylate (referred to as C-1 hereinafter), 20 parts by weight of dipentaerythritol tetraacrylate (referred to as C-2 hereinafter), 30 parts by weight of ethanone, 1-[9-ethyl-6-(2-methylbenzoyl)9H-carbazole-3-yl]-,1-(O-acetyl oxime) (referred to as D-1), 10 parts by weight of 2-benzyl-2-N,N-dimethylamino-1-(4-morpholinophenyl)-1-butanone (referred to as D-2 hereinafter), 150 parts by weight of C.I. pigment black 7 (MA100, a black pigment manufactured by Mitsubishi Chemical Corporation, referred to as F-1 hereinafter), and 3500 parts by weight of propylene glycol monomethyl ether acetate were mixed in a swing-out stirrer to obtain a homogeneous dispersion.

Examples 2 to 8 and Comparative Examples 1 to 6

Examples 2 to 8 and Comparative Examples 1 to 6 were conducted in a manner identical to that of Example 1 using the components and the amounts thereof shown in Table 1.

The photosensitive resin compositions of Examples 1 to 8 and Comparative Examples 1 to 6 were evaluated according to the following evaluation methods. The evaluation results are shown in Table 1.

Preparation of Black Matrix

Application Example 1

The photosensitive resin composition obtained in Example 1 was spin-coated on a glass substrate of 100 mm×100 mm using a coater (MS-A150 commercially available from Shinkuang Trading Co., Ltd.), followed by drying in a reduced pressure of 100 mmHg for 5 seconds, and then prebaking in an oven at a temperature of 85° C. for 3 minutes to form a prebaked film having a thickness of 2.2 μm.

The prebaked film was treated with ultra-violet irradiation using an exposure machine (Model No. AG500-4N, manufactured by M & R Nano Technology, 200 mJ/cm$^2$) through a photo-mask. The pre-baked film after the ultra-violet irradiation was immersed in a developer (0.4% potassium hydroxide solution) at 23° C. for 2 minutes, followed by washing with water and then post-baking at 200° C. for 40 minutes to obtain a back matrix having a thickness of 2.0 p.m.

Application Examples 2-8 and Comparative Application Examples 1-6

Examples 2 to 8 and Comparative Examples 1 to 6 were conducted in a manner identical to that of Application Example 1 using the components and the amounts thereof shown in Table 1.

Evaluation Methods:
1. Optical Density:

The photosensitive resin composition obtained in Examples 1-8 and Comparative Examples 1-6 were respectively spin-coated on a glass substrate of 100 mm×100 mm using a coater (MS-A150), followed by drying in a reduced pressure of 100 mmHg for 5 seconds, and then prebaking in an oven at a temperature of 100° C. for 2 minutes to form a prebaked film having a thickness of 1.2 μm.

The prebaked film was treated with ultra-violet irradiation using an exposure machine (Model No. AG500-4N, 100 mJ/cm$^2$) through a photo-mask. The pre-baked film after the ultra-violet irradiation was immersed in a developer (0.4% potassium hydroxide solution) at 23° C. for 2 minutes, followed by washing with water and then post-baking at 230° C. for 60 minutes to obtain a back matrix having a thickness of 1.0 μm.

Incident light intensity ($I_0$) and transmissive light intensity (I) of the obtained back matrix having a thickness of 1.0 μm was measured using a microspectroscope (MCPD 2000, manufactured by Otsuka Electronics Co., Ltd.). Optical density was calculated using the following formula:

$$\text{Optical Density} = \log_{10}(I_0/I).$$

The greater the value of the optical density, the better will be the light-shielding effect.

2. Stability of Surface Resistance:

Three surface resistance values were measured at three measuring points of each of the aforesaid prebaked films using a high resistance meter (Hiresta-UP MCP-HT450 manufactured by Mitsubishi Chemical Corporation). An average value ($\Omega_1$) was calculated from the three measured surface resistance values.

Each of the prebaked films was treated with ultra-violet irradiation (100 mJ/cm$^2$) through a photo-mask. Each of the pre-baked films after the ultra-violet irradiation was immersed in a developer (0.4% potassium hydroxide solution) at 23° C. for 2 minutes, followed by washing with water and then post-baking at 280° C. for 60 minutes to obtain a black matrix having a thickness of 1.0 μm. Three surface resistance values were measured at the same three measuring points of each of the black matrices using the high resistance meter. An average value ($\Omega_2$) was calculated from the three measured surface resistance values. Stability of surface resistance was determined using the following formula:

$$\text{Stability of surface resistance}(R_H) = \Omega_2/\Omega_1 \times 100\%$$

○ $R_H > 97\%$
Δ: $97\% \geq R_H > 95\%$
X: $R_H \leq 95\%$

3. Surface Smoothness:

Film thickness of each of the black matrices obtained for measuring the stability of surface resistance was measured using an atomic force microscope (Dimension Edge AFM manufactured by Veeco) at a measurement distance of 3 μm. Surface smoothness was determined using the following formula:

$$\text{Surface smoothness}(nm) = \delta_H - \delta_L,$$

wherein
$\Delta_H$ is a maximum film thickness value, and
$\Delta_L$ is a minimum film thickness value.
○: surface smoothness<60 nm
Δ: 60 nm≤surface smoothness<100 nm
X: surface smoothness≥100 nm

TABLE 1

| Components | | | Examples | | | | | | | |
|---|---|---|---|---|---|---|---|---|---|---|
| Parts by weight | | | 1 | 2 | 3 | 4 | 5 | 6 | 7 | 8 |
| alkali-soluble resin (A) | A-1-1 | | 100 | — | — | 100 | 90 | — | 30 | — |
| | A-1-2 | | — | 100 | — | — | — | 80 | — | 50 |
| | A-1-3 | | — | — | 100 | — | — | — | — | — |
| | A-2-1 | | — | — | — | — | 10 | — | — | 50 |
| | A-2-2 | | — | — | — | — | — | 20 | 70 | — |
| Polysiloxane (B) | B-1 | | 70 | 80 | — | — | 180 | — | — | — |
| | B-2 | | — | 20 | 34 | 120 | — | 40 | 120 | — |
| | B-3 | | — | — | — | — | — | — | — | 450 |

TABLE 1-continued

| | | | | | | | | | |
|---|---|---|---|---|---|---|---|---|---|
| ethylenically unsaturated compound (C) | C-1 | 100 | 100 | 120 | 140 | 100 | 100 | 120 | 120 |
| | C-2 | 20 | 20 | — | — | 20 | 5 | — | 10 |
| photo-initiator (D) | D-1 | 30 | 30 | 25 | 30 | 30 | 28 | 30 | 25 |
| | D-2 | 10 | — | 10 | 15 | 10 | — | 7 | 10 |
| black pigment (E) | E-1 | 150 | 150 | 250 | 150 | — | 150 | 200 | 180 |
| | E-2 | — | — | — | — | 70 | — | 100 | — |
| Solvent (F) | F-1 | 3500 | 3500 | 3000 | 4000 | 2800 | — | 3500 | 2500 |
| | F-2 | — | — | 400 | — | 500 | 3500 | — | — |
| Additives (G) | G-1 | — | — | 2 | — | — | 1 | — | — |
| | G-2 | — | — | — | — | — | 10 | — | 15 |
| | G-3 | — | — | — | 0.3 | — | — | — | — |
| (A-1)/B ratio | | 1.4 | 1.0 | 2.9 | 0.8 | 0.5 | 2.0 | 0.25 | 0.11 |
| Evaluation results | OD value | 3.3 | 3.2 | 4.2 | 3.3 | 3.0 | 3.4 | 5.1 | 3.8 |
| | Stability of surface resistance | ○ | ○ | ○ | ○ | ○ | ○ | ○ | ○ |
| | Surface smoothness | ○ | ○ | ○ | ○ | ○ | ○ | ○ | ○ |

| | Components | | Comparative Examples | | | | | |
|---|---|---|---|---|---|---|---|---|
| | Parts by weight | | 1 | 2 | 3 | 4 | 5 | 6 |
| alkali-soluble resin (A) | A-1-1 | | 100 | — | — | — | 30 | — |
| | A-1-2 | | — | — | — | 100 | — | — |
| | A-1-3 | | — | — | — | — | — | — |
| | A-2-1 | | — | — | 100 | — | — | 100 |
| | A-2-2 | | — | — | — | — | 70 | — |
| Polysiloxane (B) | B-1 | | — | 100 | — | 25 | — | 30 |
| | B-2 | | — | — | — | — | 350 | — |
| | B-3 | | — | — | — | — | — | — |
| ethylenically unsaturated compound (C) | C-1 | | 100 | 100 | 140 | 100 | 100 | 120 |
| | C-2 | | 20 | 20 | — | 20 | 20 | — |
| photo-initiator (D) | D-1 | | 30 | 30 | 30 | 30 | 30 | 30 |
| | D-2 | | 10 | 10 | 15 | 10 | 10 | — |
| black pigment (E) | E-1 | | 150 | 150 | 150 | 150 | — | 150 |
| | E-2 | | — | — | — | — | 70 | — |
| Solvent (F) | F-1 | | 3500 | 3500 | 4000 | 3500 | 2800 | 3500 |
| | F-2 | | — | — | — | — | 500 | — |
| Additives (G) | G-1 | | — | — | — | — | — | — |
| | G-2 | | — | — | — | — | — | — |
| | G-3 | | — | — | — | — | — | — |
| (A-1)/B ratio | | | — | 0 | — | 4 | 0.08 | 0 |
| Evaluation results | OD value | | 3.2 | 3.3 | 3.0 | 3.2 | 3.1 | 3.1 |
| | Stability of surface resistance | | X | X | X | X | X | X |
| | Surface smoothness | | X | X | X | Δ | Δ | X |

C-1: dipentaerythritol hexaacrylate;
C-2: dipentaerythritol tetraacrylate;
D-1: ethanone, 1-[9-ethyl-6-(2-methylbenzoyl)9H-carbazole-3-yl]-, 1-(O-acetyl oxime);
D-2: 2-benzyl-2-N,N-dimethylamino-1-(4-morpholinophenyl)-1-butanone;
E-1: MA100 manufactured by Mitsubishi Chemical Corporation;
E-2: MA230 manufactured by Mitsubishi Chemical Corporation;
F-1: propylene glycol monomethyl ether acetate;
F-2: ethyl 3-ethoxypropionate;
G-1: 3-methacryloyloxypropyltrimethoxysilane;
G-2: 1031S manufactured by Japan Epoxy Resins Co., Ltd.;
G-3: SINOPOL E8008 manufactured by Sino-Japan Chemical.

As shown in Table 1, all of the photosensitive resin compositions obtained in Examples 1-8 have a weight ratio of the unsaturated-group-containing resin (A-1) to the polysiloxane (B) (referred to as (A-1)/(B) ratio) ranging from 0.11 to 2.9, and the black matrices formed from the photosensitive resin compositions have good stability of surface resistance. However, the (A-1)/(B) ratios of the photosensitive resin compositions obtained in Comparative Examples 4 and 5 are 4 and 0.08, respectively, and the black matrices formed from the photosensitive resin compositions have inferior stability of surface resistance. Therefore, it is shown that the stability of surface resistance of the black matrix can be enhanced by adjusting the (A-1)/(B) ratio.

Furthermore, all of the photosensitive resin compositions obtained in Examples 1-8 contain both the unsaturated-group-containing resin (A-1) and the polysiloxane (B) so that the stability of surface resistance and the surface smoothness can be improved. However, the photosensitive resin compositions obtained in Comparative Examples 1-3 only contain one of the unsaturated-group-containing resin (A-1) and the polysiloxane (B), and the stability of surface resistance and the surface smoothness of the black matrices formed therefrom are inferior.

The photosensitive resin composition obtained in Comparative Example 6 does not contain the unsaturated-group-containing resin (A-1) and only contains the alkali-soluble resin (A-2) and the polysiloxane (B), and the stability of surface resistance and the surface smoothness of the black matrix formed therefrom are inferior.

The photosensitive resin compositions obtained in Example 1 and Comparative Examples 1 and 2 contain 150 parts by weight of the black pigment and have similar optical density (i.e., 3.3, 3.2, and 3.3, respectively). However, the black matrix formed from the photosensitive resin composition obtained in Example 1 has better stability of surface resistance and surface smoothness. It means that the black matrix formed from the photosensitive resin composition of the present invention has enhanced stability of surface resistance and surface smoothness even if the photosensitive resin composition of the present invention contains the same amount of the black pigment as the conventional photosensitive resin composition.

It is shown in Examples 3 and 7 that the black matrix formed from the photosensitive resin composition of the present invention has enhanced stability of surface resistance and surface smoothness even if the photosensitive resin composition of the present invention contains a high amount of the black pigment. Specifically, the photosensitive resin composition obtained in Example 7 contains a relatively high amount of the black pigment (i.e. 300 parts by weight), and a relatively high optical density (i.e., 5.1) can be obtained.

In view of the aforesaid, the stability of surface resistance and the surface smoothness of the black matrix can be enhanced by using the photosensitive resin composition of the present invention, in which both the alkali-soluble resin (A-2) and the polysiloxane (B) are included and in which the (A-1)/(B) ratio ranges from 0.1 to 3.0, even if a high amount of the black pigment is present in the photosensitive resin composition.

While the present invention has been described in connection with what are considered the most practical and preferred embodiments, it is understood that this invention is not limited to the disclosed embodiments but is intended to cover various arrangements included within the spirit and scope of the broadest interpretation and equivalent arrangements.

What is claimed is:

1. A photosensitive resin composition, comprising:
(A) an alkali-soluble resin including an unsaturated-group-containing resin (A-1) obtained by subjecting a mixture containing (i) an epoxy compound having at least two epoxy groups and (ii) a compound having at least one carboxyl group and at least one ethylenically unsaturated group to polymerization;
(B) a polysiloxane;
(C) an ethylenically unsaturated compound;
(D) a photo-initiator;
(E) a black pigment; and
(F) a solvent,
wherein a weight ratio of said unsaturated-group-containing resin (A-1) to said polysiloxane (B) ranges from 0.1 to 3.0, and wherein said polysiloxane (B) is obtained by subjecting a silane monomer or a combination of said silane monomer and a siloxane prepolymer to hydrolysis and partial condensation, and said silane monomer is represented by formula (V):

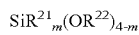

wherein m is an integer ranging from 1 to 3, $R^{21}$ independently represents a hydrogen, a substituted or unsubstituted C1-C10 alkyl group, a substituted or unsubstituted C2-C10 alkenyl group, or a substituted or unsubstituted C6-C15 aryl group, and wherein at least one of $R^{21}$ is selected from the group consisting of 3-glutaric anhydride propyl, 3-succinic anhydride propyl, and 2-succinic anhydride ethyl, and $R^{22}$ independently represents a hydrogen, a substituted or unsubstituted C1-C6 alkyl group, a substituted or unsubstituted C1-C6 acyl group, or a substituted or unsubstituted C6-C15 aryl group.

2. The photosensitive resin composition according to claim 1, wherein said weight ratio of said unsaturated-group-containing resin (A-1) to said polysiloxane (B) ranges from 0.2 to 2.5.

3. The photosensitive resin composition according to claim 1, wherein said epoxy compound (i) is represented by formula (I):

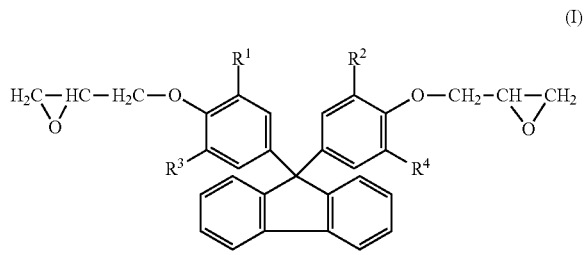

wherein $R^1$, $R^2$, $R^3$, and $R^4$ are independently selected from the group consisting of hydrogen, halogen, a $C_1$-$C_5$ alkyl group, a $C_1$-$C_5$ alkoxy group, a $C_6$-$C_{12}$ aryl group, and a $C_6$-$C_{12}$ aralkyl group.

4. The photosensitive resin composition according to claim 1, wherein said epoxy compound (i) is represented by formula (II):

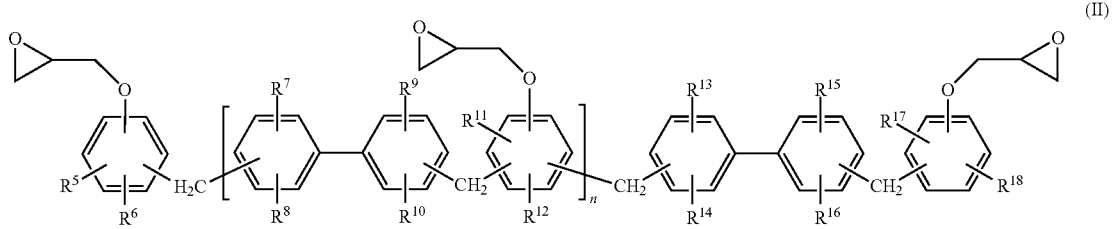

wherein $R^5$-$R^{18}$ are independently selected from the group consisting of hydrogen, halogen, a $C_1$-$C_8$ alkyl group, and a $C_6$-$C_{15}$ aryl group; and n represents an integer ranging from 0 to 10.

5. The photosensitive resin composition according to claim 1, wherein said unsaturated-group-containing resin (A-1) is in an amount ranging from 30 to 100 parts by weight, said polysiloxane (B) is in an amount ranging from 30 to 450 parts by weight, said ethylenically unsaturated compound (C) is in an amount ranging from 5 to 220 parts by weight, said black pigment (E) is in an amount ranging from 30 to 500 parts by weight, and said solvent (F) is in an amount ranging from 500 to 5000 parts by weight based on 100 parts by weight of said alkali-soluble resin (A).

6. The photosensitive resin composition according to claim 1, wherein said photo-initiator (D) is in an amount ranging from 2 to 120 parts by weight based on 100 parts by weight of said ethylenically unsaturated compound (C).

7. A black matrix formed from the photosensitive resin composition according to claim 1, wherein said black matrix having an optical density larger than 3.0 when said black matrix has a film thickness of 1 μm.

8. A color filter comprising the black matrix according to claim 7.

9. A liquid crystal display device comprising the color filter according to claim 8.

* * * * *